United States Patent
Lucchese

(10) Patent No.: US 10,338,151 B2
(45) Date of Patent: Jul. 2, 2019

(54) METHOD AND DEVICE FOR MEASURING A DC VOLTAGE SUCH AS THE VOLTAGE OF A MOTOR VEHICLE BATTERY

(71) Applicants: CONTINENTAL AUTOMOTIVE FRANCE, Toulouse (FR); CONTINENTAL AUTOMOTIVE GmbH, Hannover (DE)

(72) Inventor: Alain Lucchese, Vigoulet Auzil (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 580 days.

(21) Appl. No.: 14/778,957

(22) PCT Filed: Mar. 14, 2014

(86) PCT No.: PCT/EP2014/000709
§ 371 (c)(1),
(2) Date: Sep. 21, 2015

(87) PCT Pub. No.: WO2014/146774
PCT Pub. Date: Sep. 25, 2014

(65) Prior Publication Data
US 2016/0061900 A1 Mar. 3, 2016

(30) Foreign Application Priority Data
Mar. 21, 2013 (FR) ...................................... 1352530

(51) Int. Cl.
*G01R 19/25* (2006.01)
*G01R 31/3835* (2019.01)
*G01R 31/396* (2019.01)

(52) U.S. Cl.
CPC ..... *G01R 31/3835* (2019.01); *G01R 19/2509* (2013.01); *G01R 31/396* (2019.01)

(58) Field of Classification Search
CPC .............. G01R 31/362; G01R 19/2509; G01R 31/3658
See application file for complete search history.

(56) References Cited

U.S. PATENT DOCUMENTS 6,236,215 B1    5/2001  Kanehira
7,696,717 B2 *  4/2010  Costello ............. G01R 31/3693
                                              320/104

(Continued)

FOREIGN PATENT DOCUMENTS

CN    1229195 A    9/1999
CN   101196540 A   6/2008

(Continued)

OTHER PUBLICATIONS

International Search Report dated May 2, 2014, in corresponding PCT application.

*Primary Examiner* — Khamdan N. Alrobaie
(74) *Attorney, Agent, or Firm* — Young & Thompson

(57) ABSTRACT

A method for measuring a DC voltage such as the voltage Vbat of a motor vehicle battery, according to which the voltage Vbat is converted into a digital value Nbat by an analog-to-digital converter (3) with which a reference voltage Vref is associated. A standard voltage Vo coming from a standard voltage source (11) is, furthermore, delivered regularly to the analog-to-digital converter, and the voltage Vo is converted into a digital value Nvo, then a digital value Ncor representing the value of the voltage Vbat is computed, such that Ncor=Co×(Nbat/Nvo), where Co=Ncor_max× (2N/Vbat_max)×(Vo/Vref), Ncor_max being a value selected for coding the maximum value of Ncor, Nbat_max a digital value resulting from the conversion of the maximum voltage Vbat_max to be measured, and N the number of bits of the analog-to-digital converter.

20 Claims, 1 Drawing Sheet

(56) References Cited

U.S. PATENT DOCUMENTS

| | | | |
|---|---|---|---|
| 2005/0167418 A1* | 8/2005 | Ferre Fabregas | B60N 2/5685 |
| | | | 219/494 |
| 2005/0248351 A1 | 11/2005 | Graf | |
| 2007/0285083 A1 | 12/2007 | Kamata | |
| 2008/0169820 A1* | 7/2008 | Nishimoto | G01R 19/16542 |
| | | | 324/433 |
| 2009/0128095 A1 | 5/2009 | Masson et al. | |
| 2009/0198399 A1 | 8/2009 | Kubo et al. | |
| 2009/0224771 A1 | 9/2009 | Deveau et al. | |
| 2010/0253357 A1* | 10/2010 | Seo | G01R 19/16542 |
| | | | 324/427 |
| 2012/0112941 A1 | 5/2012 | Lyles et al. | |
| 2013/0022844 A1 | 1/2013 | Ishikawa et al. | |
| 2015/0042348 A1* | 2/2015 | Ishida | G01R 31/3606 |
| | | | 324/425 |
| 2016/0291094 A1* | 10/2016 | Gagneur | G01R 31/3651 |

FOREIGN PATENT DOCUMENTS

| | | |
|---|---|---|
| CN | 102638079 A | 8/2012 |
| DE | 10 2005 005026 A1 | 9/2005 |
| DE | 10 2004 022556 B3 | 10/2005 |
| FR | 2 899 340 A1 | 10/2007 |
| JP | 0735834 A | 2/1995 |
| JP | 10 289037 A | 10/1998 |
| JP | 3259752 B2 | 2/2002 |

\* cited by examiner

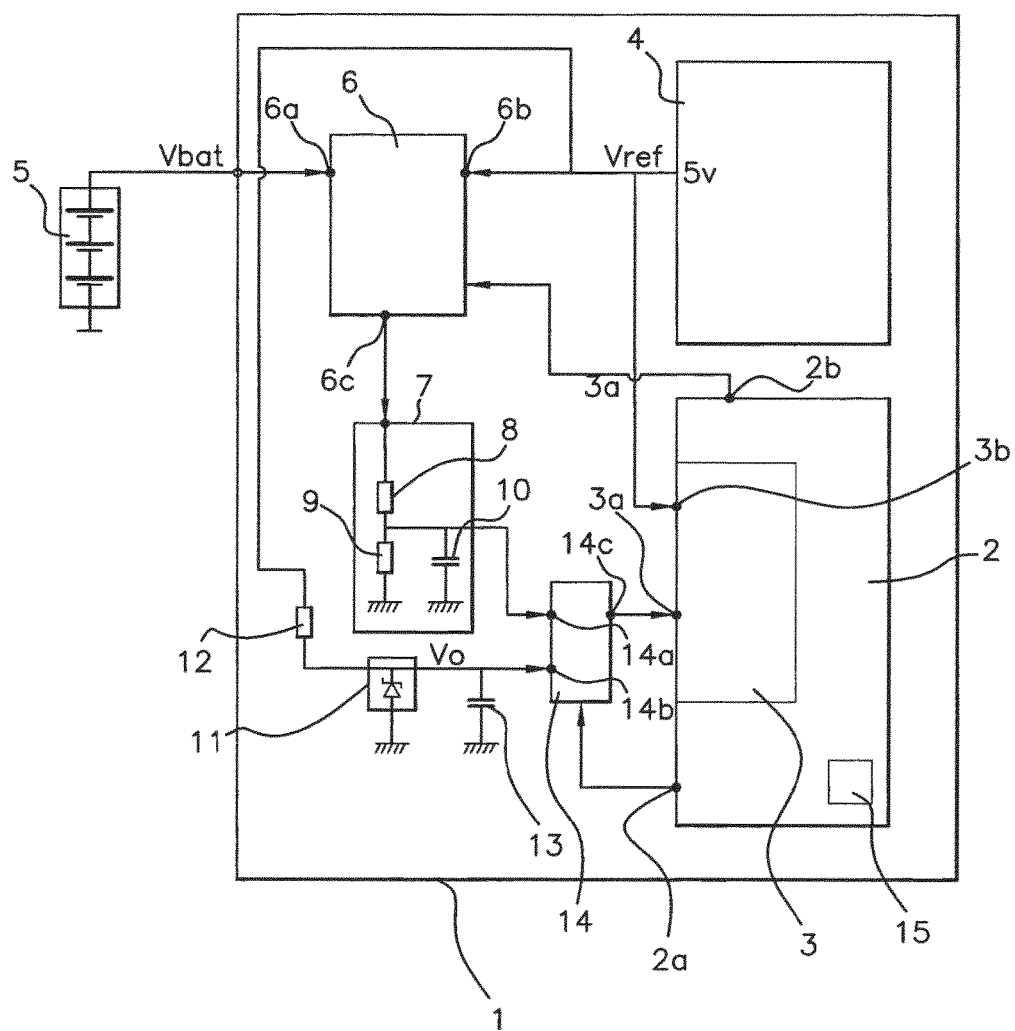

METHOD AND DEVICE FOR MEASURING A DC VOLTAGE SUCH AS THE VOLTAGE OF A MOTOR VEHICLE BATTERY

BACKGROUND OF THE INVENTION

Field of the Invention

The invention relates to a method and a device for measuring a DC voltage such as the voltage Vbat of a motor vehicle battery.

Description of the Related Art

The common methods for measuring a DC voltage such as the voltage Vbat of a motor vehicle battery conventionally consist in converting the DC voltage Vbat into a digital value Nbat by means of an analog-to-digital converter with which a reference voltage Vref is associated.

In relation to the automotive field, these measuring methods are implemented by means of measuring devices incorporated in an on-board electronic module, such as, for example, the injection control computer, and conventionally comprising:

- an analog-to-digital converter generally incorporated in the microcontroller of the electronic module,
- a voltage regulator for providing, in addition to the internal power supply of the electronic module, the analog-to-digital converter with a reference voltage Vref.

The precision of the measurements carried out by means of such measuring devices, of a value of approximately ±800 mV, is normally sufficient for the majority of the uses of the automotive computers.

However, certain recent uses such as the uses for vehicles provided with a "stop and start" device (device stopping the operation of the driving internal combustion engine during the prolonged stopping stages and starting it as soon as the driver of the vehicle demonstrates the intention to move the vehicle again) have stricter requirements than the precisions accepted for the common uses of the information in relation to the value of the voltage of the battery. These uses, which require knowledge of the battery charge state, indeed necessitate a precision of approximately ±200 mV.

The studies carried out in order to resolve this problem have shown that the main source of error resulted from the spread of the reference voltage Vref of the analog-to-digital converter. Indeed, the spread of this reference voltage, of approximately ±2% for the common voltage regulators of the automotive field, is fully transferred to the measurement of the voltage of the battery, and results in a measuring error of approximately ±240 mV, which is greater than the measuring error accepted for some specific uses.

In view of these findings, the solutions currently studied aim to improve the performances of the voltage regulators with regard to the precision of the reference voltage Vref provided.

However, all of the current solutions lead to a considerable additional cost for the voltage regulators which notably impacts upon the cost of the electronic modules.

Moreover, particularly in the automotive field, the methods for measuring a DC voltage generally require the DC voltage to be adapted to the operating characteristics of the analog-to-digital converter by means of a level adapter having a gain k.

Yet, this adapting step implemented by means of a level adapter consisting generally, in the automotive field, of a divider bridge made up of resistors, represents an additional error source, the origin of which is the spread of the values of the components of the level adapter.

As above, the solutions currently proposed consist, in order to produce the level adapter, in using reduced tolerance components.

However, in addition to the increase in cost (by a factor greater than 5 for a divider bridge), it proves almost impossible to completely protect against the use of a non-compliant component, particularly with respect to the temperature drift coefficient thereof.

BRIEF SUMMARY OF THE INVENTION

The aim of the present invention is to eliminate these disadvantages and provide a method and a device for measuring a DC voltage resulting in notably increasing the precision of the measurements for a reasonable additional cost compared to the cost of the current measuring devices, and, particularly in the automotive field, allowing the precision requirements (of approximately ±200 mV) of "stop and start" type uses to be met.

To this end, the invention firstly relates to a method for measuring a DC voltage such as the voltage Vbat of a motor vehicle battery, according to which the voltage Vbat is converted into a digital value Nbat by means of an analog-to-digital converter with which a reference voltage Vref is associated, said measuring method consisting, according to the invention, in:

- delivering, to the analog-to-digital converter, a standard voltage Vo coming from a standard voltage source, and converting the voltage Vo into a digital value Nvo,
- computing a digital value Ncor representing the digital value of the voltage Vbat, such that:

$$Ncor=Co\times(Nbat/Nvo),$$

Co consisting of a constant such that:

$$Co=Ncor\_max\times(2N/Nbat\_max)\times(Vo/Vref), \text{ where:}$$

- Ncor_max is a value selected for coding the maximum value of Ncor,
- Nbat_max a digital value resulting from the conversion of the maximum DC voltage Vbat_max to be measured,
- N the number of bits of the analog-to-digital converter.

The invention consisted therefore, with a view to obtaining digital values Ncor forming digital values of the voltage Vbat which are corrected for the variations in the reference voltage Vref of the analog-to-digital converter, in:

- adding, to the measuring current devices, a voltage standard formed from a source of precise voltage of value Vo, and
- combining the results of the analog-to-digital conversions of the DC voltage Vbat, and of the standard voltage Vo, by using a proportionality factor consisting of a specific constant Co for scaling the values Ncor.

In practice, this solution results in providing a digital image of the corrected DC voltage which is therefore independent of the variations in the reference voltage Vref of the analog-to-digital converter, which proves to particularly meet, in the automotive field, the requirements for a precision of approximately ±200 mV.

Moreover, such a solution simply requires the addition of a component for producing the voltage standard, the cost of which is moderate compared to the additional cost incurred by replacing a conventional voltage regulator with a precision voltage regulator.

Moreover, particularly in the automotive field, since the presence of this voltage standard is specifically linked to the requirement for increased precision of the measurements of the voltage of the battery, the addition and therefore the cost thereof should only be considered within the context of uses necessitating this increased precision.

According to an advantageous embodiment of the invention, the constant Co is such that $Co=Ncor\_max \times (Vo/Vref)$.

This value of the constant Co results, indeed, in using the entire dynamics of the analog-to-digital converter (Nbat_max=2N) for the maximum value Vbat_max of the voltage to be measured.

According to another advantageous embodiment of the invention:
- in a prior stage, a digital calibration procedure is carried out which consists in:
  - simulating a voltage Vbat and acquiring the corresponding digital value Nbat_test,
  - acquiring the digital value Nvo_test corresponding to the voltage Vo,
  - deducing, from these acquired values, a digital value Ncor_test such that $Ncor\_test = Co \times (Nbat\_test/Nvo\_test)$,
  - computing the ideal theoretical value Ncor_th of the digital value Ncor_test, and determining and storing an adjustment coefficient Baj such that $Baj=Ncor\_th/Ncor\_test$,
- during the measuring operations, digital values Ncor representing the values of the voltage Vbat are computed, such that: $Ncor=Baj \times Co \times (Nbat/Nvo)$.

This preliminary step allows, indeed, the correction of the imperfections, in terms of initial tolerances, of the voltage standard by implementing a method of digital calibration during the process for manufacturing the measuring device according to the invention.

Moreover, commonly, the methods for measuring a DC voltage require the voltage Vbat to be adapted to the operating characteristics of the analog-to-digital converter by means of a level adapter having a gain k, where k≥1 or k≱1 depending on the Vbat value, therefore resulting in converting, into a digital value, a voltage (k×Vbat).

In this case, the measuring method according to the invention consists advantageously in:
- regularly delivering the reference voltage Vref to the level adapter, and converting said reference voltage Vref into a digital voltage $Nr=2N \times k$, and
- computing a digital value Ncor representing the value of the voltage Vbat, such that:

$$Ncor=Nbat \times (Nro/Nr) \times (Co/Nvo), \text{ where}$$

$Nro=2N \times ko$ where ko consists of the ideal value of the gain k.

It should be noted that, according to the invention, the ideal value ko of the gain k commonly means the value of the gain corresponding to the nominal values of the components of the level adapter.

Such a measuring method results, indeed, in computing, in real-time, a value of the result of the analog-to-digital conversion of the DC voltage to be measured, corrected for the variations in the level adapter.

The "quality" of this correction can, furthermore, be improved with an increase in the number of bits of the analog-to-digital converter, and to this end, in an advantageous manner according to the invention, this number of bits is artificially increased by using oversampling and running mean techniques during the acquisition of the voltages Vbat and of the reference voltage Vref.

By combining the implementation of the digital calibration preliminary step, and the respective steps for reducing the error linked to the spread of the reference voltage Vref and for reducing the error linked to the level adapter, the measuring method according to the invention, therefore, leads advantageously to computing digital values Ncor such that:

$$Ncor=Nbat \times (Nro/Nr) \times Baj \times (Co/Nvo).$$

It should be noted that, in this expression, since the constant (Co×Nro×Baj) is specific to each measurement unit, the constant (Co×Nro×Baj) is, advantageously according to the invention, stored in storage means.

Moreover, according to an advantageous embodiment relating more specifically to the nature of the measuring means used according to the invention, the voltage Vbat and the voltage Vo are delivered to two separate inputs of a multiplexer suitable for allowing one then the other of said voltages to be directed to the analog-to-digital converter.

Such a multiplexer is particularly required when the analog-to-digital converter does not have an available channel for the measurement of the standard voltage Vo. In this case, this multiplexer allows, indeed, either this signal coming from the DC voltage source, or the signal coming from the standard voltage source to be alternately selected, in order to direct them to the channel of the analog-to-digital converter dedicated to measuring the voltage of the battery.

According to another advantageous embodiment relating more specifically to the nature of the measuring means used according to the invention, the voltage Vbat and the reference voltage Vref are delivered to two separate inputs of a multiplexer suitable for allowing one then the other of said voltages to be directed to the level adapter.

Moreover, advantageously according to the invention, the reference voltage Vref is produced by means of a voltage regulator.

Furthermore, advantageously according to the invention, the standard voltage source is fed by means of the voltage regulator.

The invention extends to a device for measuring a DC voltage Vbat produced by a DC voltage source such as a motor vehicle battery, including an analog-to-digital converter suitable for converting the voltage Vbat into a digital value Nbat, and a voltage source suitable for providing the analog-to-digital converter with a reference voltage Vref. According to the invention, this measuring device includes:
- a voltage standard consisting of a standard voltage source connected to the analog-to-digital converter such as to provide the latter with a standard voltage Vo,
- a computation unit programmed to compute a digital value Ncor representing the digital value of the voltage Vbat, such that:

$$Ncor=Co \times (Nbat/Nvo),$$

Co consisting of a constant such that:

$$Co=Ncor\_max \times (2N/Nbat\_max) \times (Vo/Vref), \text{ where:}$$

Nvo is a digital value resulting from the conversion of the standard voltage Vo, Ncor_max a value selected for coding the maximum value of Ncor, Nbat_max a digital value resulting from the conversion of the maximum voltage Vbat_max to be measured, N the number of bits of the analog-to-digital converter.

Moreover, commonly, this measuring device includes a level adapter having a gain k, intended for adapting the voltage Vbat to the operating characteristics of the analog-to-digital converter, and in this case, furthermore, in an advantageous manner according to the invention:
- it comprises a multiplexer including two inputs connected to the DC voltage source and to the reference voltage source, respectively, and an output connected to the level adapter,
- the computation unit is programmed, firstly, to control the multiplexer with a view to selecting the input connected to the output, and secondly, to compute a digital value Ncor representing the value of the voltage Vbat, such that:

$$Ncor = Nbat \times (Nro/Nr) \times (Co/Nvo), \text{ where:}$$

Nro=2N×ko where ko consists of the ideal value of the gain k.

BRIEF DESCRIPTION OF THE DRAWINGS

Other features, aims and advantages of the invention will emerge from the following detailed description with reference to the appended drawing which shows, by way of nonlimiting example, a preferential embodiment thereof. In this drawing, FIG. 1 shows an electronic module incorporating a measuring device in accordance with the invention.

DETAILED DESCRIPTION OF THE PREFERRED EMBODIMENTS

The electronic module shown in FIG. 1 consists of a computer 1, such as an injection control computer, intended to be on board a motor vehicle, and incorporating a device for measuring the voltage of the battery 5 of said vehicle.

This computer 1 includes, firstly:
- a microcontroller 2 incorporating, particularly, a memory 15, for example an EEPROM (Electrically Erasable Programmable Read-Only Memory) or flash EPROM memory, suitable for permanently retaining data, and an analog-to-digital converter 3 particularly including a channel 3a dedicated to measuring the voltage of the battery 5, and a channel 3b for receiving the reference voltage Vref of this analog-to-digital converter 3,
- a voltage regulator 4 for feeding all of the electronic components of the computer 1, and particularly suitable for delivering a reference voltage Vref equal to 5 V to the channel 3b of the analog-to-digital converter 3,
- a level adapter 7 having a gain k and consisting, in the example, of a resistive divider bridge for adapting the voltage Vbat of the battery 5 to the operating characteristics of the analog-to-digital converter 3.

This divider bridge further includes, in a conventional manner, two series resistors 8, 9 and a capacitor 10.

Moreover, according to the invention, this computer 1 incorporates, firstly, a first multiplexer 6 inserted between the battery 5 and the level adapter 7, including two inputs 6a, 6b connected to the battery 5 and to the voltage regulator 4, respectively, and an output 6c connected to the input of the level adapter 7.

This multiplexer 6 allows either the signal Vbat coming from the battery 5, or the signal Vref provided by the voltage regulator 4 to be selected, in order to direct them to the input of the level adapter 7, the selection of the signal delivered to the output 6c being controlled by the microcontroller 2 by means of a logic port 2b configured as an output.

According to the invention, the computer 1 also incorporates a voltage standard consisting of a standard voltage source 11 connected, firstly, to the voltage regulator 4, with insertion of a bias resistor 12, such as to be fed by the latter, and secondly, to the channel 3a of the analog-to-digital converter 3, with insertion of a capacitor 13, such as to provide a standard voltage Vo to said analog-to-digital converter 3.

The computer 1 incorporates, finally, according to the invention, a multiplexer 14 inserted between, firstly, the level adapter 7 and the standard voltage source 11, and secondly, the channel 3a of the analog-to-digital converter 3. This multiplexer 14 includes two inputs 14a, 14b connected to the level adapter 7 and to the standard voltage source 11, respectively, and an output 14c connected to the channel 3a of the analog-to-digital converter 3.

This multiplexer 14 allows either the signal k×Vbat coming from the level adapter 7, or the signal Vo coming from the standard voltage source 11 to be alternately selected, in order to direct them to the channel 3a of the analog-to-digital converter 3, the selection of the signal to be measured being controlled by the microcontroller 2 by means of a logic port 2a configured as an output.

According to the invention, firstly, the signal received on the channel 3a of the analog-to-digital converter 3 consists, alternately, either of the standard voltage Vo, or of the signal coming from the level adapter 7 formed, alternately, either from the signal (k×Vbat) or from the signal (k×Vref).

The digital values resulting from the analog-to-digital conversion of these signals are as follows:
- signal (k×Vref) acting as a reference voltage for the analog-to-digital converter 3: Nr=2N×k,
- signal (k×Vbat): Nbat=2N×(k×Vbat)/Vref,
- signal Vo: Nvo=2N×Vo/Vref.

Based on this data, firstly, the principle for correcting the voltage Vbat intended to reduce the error linked to the spread of the value of the reference voltage Vref consists in defining that: Ncor(ref)=Co×(k×Vbat)/Vo, where Ncor(ref) is a corrected value of the analog-to-digital acquisition of the voltage Vbat.

A combination of this value Ncor(ref) with the values Nbat and Nvo defined above gives a corrected value Ncor (ref) such that: Ncor(ref)=Co×Nbat/Nvo.

In this expression, Co represents the constant for scaling the value Ncor(ref), and the determination thereof depends on the value chosen for coding the maximum value of Ncor(ref), namely Ncor_max.

According to the invention, the value of Co is, therefore, as follows:

$$Co = Ncor\_max \times (2N/Nbat\_max) \times (Vo/Vref) \text{ where:}$$

Nbat_max is a digital value resulting from the conversion of the maximum voltage Vbat_max to be measured, N is the number of bits of the analog-to-digital converter 3.

Moreover, the gain k chosen, according to the invention, for the level adapter 7 is such that the entire dynamics of the analog-to-digital converter 3 are used for Vbat_max, and consequently Nbat_max=2N.

As a result, the two following equivalent formulas can be used to compute Co:

$$Co = Ncor\_max \times (Vo/Vref).$$

$$Co = Ncor\_max \times (Vo/(k \times Vbat\_max)).$$

Secondly, the principle for correcting the voltage Vbat intended to reduce the error linked to the level adapter 7 consists in attributing to the corrected value Ncor(ad) the ideal value of Nbat corresponding to the value obtained for an ideal gain ko of the level adapter 7.

As a result, Ncor(ad)=2N×(ko×Vbat)/Vref.

By combining this equation with the following equations:

$k = k_o \times (Nr/Nro)$, where $Nro$ is the ideal result of $Nr$, $Nro = 2N \times k_o$, where $k_o$ is the ideal value of the gain $k$, then $Ncor(ad) = Nbat \times Nro/Nr$.

As a result, by combining the two principles for correcting the voltage Vbat which are described above, the method according to the invention results in defining a corrected value Ncor of the analog-to-digital acquisition of the voltage Vbat obtained by combining the corrected values Ncor(ref) and Ncor(ad) and such that: $Ncor = Nbat \times (Nro/Nr) \times (Co/Nvo)$.

Furthermore, in order to overcome the imperfections, in terms of initial tolerances, of the voltage standard 11, and, if desired, of the level adapter 7, the invention consists in implementing a digital calibration method during the process for manufacturing the computer 1, consisting, firstly, in a prior phase carried out during the testing of each computer 1, in:
  injecting a precision stimulus in order to simulate a voltage Vbat, and acquiring the digital value Nbat_test corresponding to this voltage Vbat, and the digital value Nvo_test corresponding to the voltage Vo,
  deducing, from these acquired values, digital values Ncor_test such that $Ncor\_test = Co \times (Nbat\_test/Nvo\_test)$,
  computing the ideal theoretical value Ncor_th of the digital values Ncor_test, and determining and storing an adjustment coefficient Baj such that $Baj = Ncor\_th/Ncor\_test$.

This digital calibration method results, during use of the computer 1, in taking into account the adjustment coefficient Baj, such as to define an overall corrected value Ncor such that: $Ncor = Nbat \times (Nro/Nr) \times Baj \times (Co/Nvo)$, wherein $(Co \times Nro \times Baj)$ forms a constant specific to each computer 1, which constant is stored in the memory 15 of each of said computers 1.

Lastly, the "quality" of the correction can also be improved with an increase in the number of bits of the analog-to-digital converter 3, and to this end, this number of bits is artificially increased by using oversampling and running mean techniques during the acquisition of the voltages Vbat and of the reference voltage Vref.

Therefore, the method and the device for measuring a DC voltage according to the invention result, with the simple addition of a low-cost standard voltage source 11 and of two multiplexers 6, 14, in meeting the precision requirements of certain current uses which necessitate, for example, a measuring precision of approximately ±200 mV.

The invention claimed is:

1. A method for measuring a DC voltage, the DC voltage being voltage Vbat of a motor vehicle battery, according to which the voltage Vbat is converted into a digital value Nbat by an analog-to-digital converter with which a reference voltage Vref is associated, the method comprising:
  delivering, to the analog-to-digital converter, a standard voltage Vo coming from a standard voltage source;
  converting the standard voltage Vo into a digital value Nvo; and
  computing a digital value Ncor representing the digital value of the voltage Vbat, such that:

$Ncor = Co \times (Nbat/Nvo)$,

Co consisting of a constant such that:

$Co = Ncor\_max \times (2N/Nbat\_max) \times (Vo/Vref)$, where:
  Ncor_max is a value selected for coding the maximum value of Ncor,
  Nbat_max is a digital value resulting from the conversion of the maximum voltage Vbat_max to be measured, and
  N is the number of bits of the analog-to-digital converter.

2. The measuring method as claimed in claim 1, wherein the constant Co is such that $Co = Ncor\_max \times (Vo/Vref)$.

3. The measuring method as claimed in claim 1, wherein the voltage Vbat and the voltage Vo are delivered to two separate inputs of a multiplexer configured to allow one of the voltage Vbat and the voltage Vo then the other of said voltage Vbat and the voltage Vo to be directed to the analog-to-digital converter.

4. The measuring method as claimed in claim 1, wherein:
  prior to the receiving, the converting, and the computing, carrying out a digital calibration procedure, consisting in:
    simulating the voltage Vbat and acquiring the corresponding digital value Nbat_test,
    acquiring the digital value Nvo_test corresponding to the voltage Vo,
    deducing, the acquired digital value Nbat_test and the digital value Nvo_test, a digital value Ncor_test such that $Ncor\_test = Co \times (Nbat\_test/Nvo\_test)$, and
    computing the ideal theoretical value Ncor_th of the digital value Ncor_test, and determining and storing an adjustment coefficient Baj such that $Baj = Ncor\_th/Ncor\_test$,
  during the measuring operations, digital values Ncor representing the values of the voltage Vbat are computed, such that: $Ncor = Baj \times Co \times (Nbat/Nvo)$.

5. The measuring method as claimed in claim 4, further comprising:
  adapting the voltage Vbat to operating characteristics of the analog-to-digital converter by a level adapter having a gain k; and
  after the adapting the voltage Vbat, converting the voltage $(k \times Vbat)$ into a digital value, wherein:
    the reference voltage Vref is regularly delivered to the level adapter, and said reference voltage Vref is converted into a digital value $Nr = 2N \times k$,
    the digital value Ncor representing the value of the voltage Vbat is computed, such that:

$Ncor = Nbat \times (Nro/Nr) \times (Co/Nvo)$, where $Nro = 2N \times k_o$, where $k_o$ consists of the ideal value of the gain $k$.

6. The measuring method as claimed in claim 5, wherein oversampling and running mean techniques are used during the acquisition of the voltages Vbat and of the reference voltage Vref.

7. The measuring method as claimed in claim 5, wherein digital values Ncor are computed such that: $Ncor = Nbat \times (Nro/Nr) \times Baj \times (Co/Nvo)$.

8. The measuring method as claimed in claim 7, wherein the constant $(Co \times Nro \times Baj)$ specific to each of at least one measurement unit is stored in a storage.

9. The measuring method as claimed in claim 5, wherein the voltage Vbat and the reference voltage Vref are delivered to two separate inputs of a multiplexer configured to allow one of the voltage Vbat and the reference voltage Vref, then the other of said voltage Vbat and the reference voltage Vref to be directed to the level adapter.

10. The measuring method as claimed in claim 1, wherein the reference voltage Vref is produced by a voltage regulator.

11. The measuring method as claimed in claim 10, wherein the standard voltage source is fed by the voltage regulator.

12. A device for measuring a DC voltage Vbat produced by a DC voltage source, the DC voltage source being a motor vehicle battery, the device comprising:
  an analog-to-digital converter configured to convert the voltage Vbat into a digital value Nbat;
  a voltage source configured to provide the analog-to-digital converter with a reference voltage Vref, said measuring device including:
    a voltage standard consisting of a standard voltage source connected to the analog-to-digital converter to provide the analog-to-digital converter with a standard voltage Vo; and
    a computation device programmed to compute a digital value Ncor representing the digital value of the voltage Vbat, such that:

$$Ncor=Co\times(Nbat/Nvo),$$

Co consisting of a constant such that:

$$Co=Ncor\_max\times(2N/Nbat\_max)\times(Vo/Vref),$$

where:
Nvo is a digital value resulting from the conversion of the standard voltage Vo,
Ncor_max is a value selected for coding the maximum value of Ncor,
Nbat_max is a digital value resulting from the conversion of the maximum DC voltage Vbat_max to be measured, and
N is the number of bits of the analog-to-digital converter.

13. The measuring device as claimed in claim 12, further comprising:
  a level adapter having a gain k, configured to adapt the voltage Vbat to operating characteristics of the analog-to-digital converter; and
  a multiplexer including two inputs connected to the DC voltage source and to the reference voltage source, respectively, and an output connected to the level adapter,
  wherein the computation device is programmed to control the multiplexer to select the input connected to the output, and to compute a digital value Ncor representing the value of the voltage Vbat, such that:

$$Ncor=Nbat\times(Nro/Nr)\times(Co/Nvo), \text{ where:}$$

Nro=2N×ko, where ko consists of the ideal value of the gain k.

14. The measuring method as claimed in claim 2, wherein the voltage Vbat and the voltage Vo are delivered to two separate inputs of a multiplexer configured to allow one of the voltage Vbat and the voltage Vo then the other of said voltage Vbat and the voltage Vo to be directed to the analog-to-digital converter.

15. The measuring method as claimed in claim 2, wherein:
  prior to the receiving, the converting, and the computing, carrying out a digital calibration procedure, consisting in:
    simulating the voltage Vbat and acquiring the corresponding digital value Nbat_test,
    acquiring the digital value Nvo_test corresponding to the voltage Vo,
    deducing, the acquired digital value Nbat_test and the digital value Nvo_test, a digital value Ncor_test such that Ncor_test=Co×(Nbat_test/Nvo_test), and
    computing the ideal theoretical value Ncor_th of the digital value Ncor_test, and determining and storing an adjustment coefficient Baj such that Baj=Ncor_th/Ncor_test,
  during the measuring operations, digital values Ncor representing the values of the voltage Vbat are computed, such that: Ncor=Baj×Co×(Nbat/Nvo).

16. The measuring method as claimed in claim 1, further comprising:
  adapting the voltage Vbat to operating characteristics of the analog-to-digital converter by a level adapter having a gain k; and
  after the adapting the voltage Vbat, converting the voltage (k×Vbat) into a digital value, wherein:
    the reference voltage Vref is regularly delivered to the level adapter, and said reference voltage Vref is converted into a digital value Nr=2N×k,
    the digital value Ncor representing the value of the voltage Vbat is computed, such that:

$$Ncor=Nbat\times(Nro/Nr)\times(Co/Nvo), \text{ where}$$

Nro=2N×ko, where ko consists of the ideal value of the gain k.

17. The measuring method as claimed in claim 2, further comprising:
  adapting the voltage Vbat to operating characteristics of the analog-to-digital converter by a level adapter having a gain k; and
  after the adapting the voltage Vbat, converting the voltage (k×Vbat) into a digital value, wherein:
    the reference voltage Vref is regularly delivered to the level adapter, and said reference voltage Vref is converted into a digital value Nr=2N×k,
    the digital value Ncor representing the value of the voltage Vbat is computed, such that:

$$Ncor=Nbat\times(Nro/Nr)\times(Co/Nvo), \text{ where}$$

Nro=2N×ko, where ko consists of the ideal value of the gain k.

18. The measuring method as claimed in claim 3, further comprising:
  adapting the voltage Vbat to operating characteristics of the analog-to-digital converter by a level adapter having a gain k; and
  after the adapting the voltage Vbat, converting the voltage (k×Vbat) into a digital value, wherein:
    the reference voltage Vref is regularly delivered to the level adapter, and said reference voltage Vref is converted into a digital value Nr=2N×k,
    the digital value Ncor representing the value of the voltage Vbat is computed, such that:

$$Ncor=Nbat\times(Nro/Nr)\times(Co/Nvo), \text{ where}$$

Nro=2N×ko, where ko consists of the ideal value of the gain k.

19. The measuring method as claimed in claim 16, wherein oversampling and running mean techniques are used during the acquisition of the voltages Vbat and of the reference voltage Vref.

20. The measuring method as claimed in claim 16, wherein the voltage Vbat and the reference voltage Vref are delivered to two separate inputs of a multiplexer configured to allow one of the voltage Vbat and the reference voltage Vref, then the other of said voltage Vbat and the reference voltage Vref to be directed to the level adapter.

* * * * *